(12) United States Patent
Zhang et al.

(10) Patent No.: US 9,907,184 B2
(45) Date of Patent: Feb. 27, 2018

(54) MANUFACTURING METHOD FOR A POWER SUPPLY MODULE

(71) Applicant: SUMIDA ELECTRIC (H.K.) COMPANY LIMITED, Hong Kong S.A.R. (CN)

(72) Inventors: Hongnian Zhang, Hong Kong (CN); Yanfei Liu, Kingston (CA); Douglas James Malcolm, Algonquin, IL (US)

(73) Assignee: SUMIDA ELECTRIC (H.K.) COMPANY LIMITED, Hong Kong (CN)

( * ) Notice: Subject to any disclaimer, the term of this patent is extended or adjusted under 35 U.S.C. 154(b) by 0 days.

(21) Appl. No.: 14/845,631

(22) Filed: Sep. 4, 2015

(65) Prior Publication Data

US 2016/0073509 A1    Mar. 10, 2016

(30) Foreign Application Priority Data

Sep. 5, 2014   (CN) .......................... 2014 1 0453325
Jul. 8, 2015   (CN) .......................... 2015 1 0396912

(51) Int. Cl.
| | | |
|---|---|---|
| H05K 3/30 | (2006.01) | |
| H05K 3/28 | (2006.01) | |
| H01F 27/02 | (2006.01) | |

(52) U.S. Cl.
CPC ........... *H05K 3/284* (2013.01); *H01F 27/022* (2013.01); *H05K 2201/086* (2013.01);
(Continued)

(58) Field of Classification Search
CPC ................. H01F 27/022; H05K 3/284; H05K 2203/1105; H05K 2203/0195;
(Continued)

(56) References Cited

U.S. PATENT DOCUMENTS 7,265,651 B2 *  9/2007  Brunner ................ H01F 27/255
                                                            336/233

7,531,893 B2 *  5/2009  Koduri .................. H01F 17/045
                                                             257/676
(Continued)

FOREIGN PATENT DOCUMENTS

CN      102256443 A      11/2011
CN      102810392 A      12/2012
(Continued)

OTHER PUBLICATIONS

First Office Action with English Translation dated Oct. 3, 2017 issued in the corresponding Chinese Application No. 201510396912.X, pp. 1-28.

*Primary Examiner* — Donghai D Nguyen

(74) *Attorney, Agent, or Firm* — Polsinelli PC

(57) ABSTRACT

A power supply module and its manufacturing method are disclosed. The manufacturing method for the power supply module includes: configuring a coil such that coil terminals are configured by way of electrical connection in the preset circuit connection configuration of the connector; preparing a mold cavity, and placing the connector housed with the coil and the electronic components into the mold cavity; making a magnetic mixture, and filling the mold cavity where the connector is placed with the magnetic mixture to form a magnetic body under pressure, wherein the magnetic body encapsulates at least the coil, the electronic components and a portion of the connector adapted to house the coil and the electronic components, and the terminal is exposed outside the magnetic body; demolding the magnetic body from the mold cavity; and increasing the temperature of the demolded magnetic body by heating. In this way, the molding pressure for forming the power supply module is lower and the manufactured power supply module has good performance of heat transfer.

28 Claims, 5 Drawing Sheets

(52) U.S. Cl.
CPC ............. *H05K 2203/0195* (2013.01); *H05K 2203/0278* (2013.01); *H05K 2203/1105* (2013.01); *Y10T 29/49146* (2015.01)

(58) Field of Classification Search
CPC ...... H05K 2203/0278; H05K 2201/086; Y10T 29/49126; Y10T 29/4913; Y10T 29/49146
USPC .......... 29/830, 832, 841; 257/676, 692, 784; 336/233
See application file for complete search history.

(56) References Cited

U.S. PATENT DOCUMENTS

| | | |
|---|---|---|
| 9,087,634 B2 * | 7/2015 | Sakamoto ............. H01F 27/022 |
| 2006/0108663 A1 | 5/2006 | Sanzo et al. |
| 2007/0257759 A1 | 11/2007 | Lee et al. |
| 2011/0242775 A1 | 10/2011 | Schaible et al. |
| 2012/0180533 A1 | 7/2012 | Song et al. |
| 2014/0285297 A1 | 9/2014 | Malcolm et al. |

FOREIGN PATENT DOCUMENTS

| | | |
|---|---|---|
| CN | 102587088 A | 1/2013 |
| CN | 203166744 U | 8/2013 |

* cited by examiner

MANUFACTURING METHOD FOR A POWER SUPPLY MODULE

CROSS REFERENCE TO RELATED APPLICATIONS

This application claims benefit of Chinese Application No. 2014-10453325.5, filed Sep. 5, 2014 and Chinese Application No. 2015-10396912.X, filed Jul. 8, 2015, the contents of which are incorporated by reference herein in its entirety.

FIELD

The present invention relates to a power supply module and its manufacturing method.

BACKGROUND

In the field of electronic products, in order to provide an accurate voltage and an accurate current required by the operation of an electronic product, electronic components such as inductance, capacitor, resistor and integrated circuit chip, are generally integrated into one power supply module, for example, Power Supply in Package, to perform voltage or current conversion. In a traditional manufacturing method for integrated power supply module, the independent electronic components (such as capacitor, resistor and integrated circuit) and coils are respectively assembled on a PCB or other substrates to form desired connections, and are encapsulated by a plastic encapsulating material. Such process is likely to generate cracks and has poor heat transfer characteristics and high cost. To overcome the above problems, a technique is presented, in which a magnetic body with a pre-processed mounting space is covered on the PCB, and the mounting space reserved in the magnetic body is used for holding components such as electronic components and coil, but this process is complex and the power supply module processed has large volume and poor heat transfer. Another technique with magnetic material mixture encapsulating is generally used for manufacturing inductors, in which the cold-pressing process used when encapsulating requires great pressure, which causes high cost and is likely to damage the internal components, such as integrated circuits, resistors and capacitor, etc.

SUMMARY

It is therefore the objective of the present invention to provide a power supply module and its manufacturing method to overcome the defects in the prior art, in which the pressure for forming the power supply module is lower to avoid damaging the internal components, and the manufactured power supply module has good performance of heat transfer.

According to an aspect of the present invention, a manufacturing method for a power supply module is provided, including the followings steps:

providing a connector with a preset circuit connection configuration, and providing a terminal adapted for external electrical connection on the connector;

configuring electronic components including at least an integrated circuit chip, in the preset circuit connection configuration of the connector by electrical connection configuring a coil such that coil terminals are electrically connected to the other circuit parts in the preset circuit connection configuration;

preparing a mold cavity, and placing the connector housed with the coil and the electronic components into the mold cavity;

making a magnetic mixture, and filling the magnetic mixture in the mold cavity where the connector is placed to form a magnetic body under pressure, wherein the magnetic body encapsulates at least the coil, the electronic components and a portion of the connector adapted to house the coil and the electronic components, and the terminal is exposed outside the magnetic body;

demoulding the magnetic body from the mold cavity; and increasing the temperature of the demoulded magnetic body by heating.

In one embodiment, the magnetic mixture is a powder mixture including by weight 85 to 95 parts of magnetic powder and 5 to 15 parts of resin.

In one embodiment, the magnetic mixture further includes by weight 0 to 5 parts of additive.

The magnetic powder is selected either from the group consisting of sintered or presintered ferrite powder, alloyed powder, amorphous or microcrystal powder, iron powder and any of the combinations thereof.

Particle size of the magnetic powder has a distribution range of 125 um to 400 um.

The pressure applied on the magnetic mixture in the above steps is intermittent with pressure value less than or equal to 0.5 kilogram per square centimeter, with total repetition of 100 to 300 times at a repetition frequency of 100 to 300 times per minute.

After forming a magnetic body by intermittent pressurization, the manufacturing method further includes the following steps:

applying both the pressure of 5 to 15 kilograms per square centimeter, and the heat with a temperature of 130 to 160 degrees Celsius on the magnetic body for 5 to 20 minutes; and cooling the magnetic body to room temperature before demoulding.

The temperature for increasing the temperature of the demoulded magnetic body by heating in the above steps increases from room temperature to 100 to 150 degrees Celsius, and time for increasing the temperature of the demoulded magnetic body by heating is 120 to 480 minutes.

The resin is a thermosetting resin.

The magnetic mixture comprises by weight 92 parts of carboxyl iron power and 8 parts of epoxy resin, and the intermittent pressure applied on the magnetic mixture has a pressure of 0.2 kilogram per square centimeter, with total repetition of 200 times at a repetition frequency of 250 times per minute; the heat and pressure simultaneously applied to the magnetic body is 15 kilograms per square centimeter in 160 degrees Celsius for 5 minutes; and the temperature for increasing the temperature of the demoulded magnetic body by heating increases from room temperature to 150 degrees Celsius with a rate of 1 degree Celsius rise per minute, wherein the temperature is maintained for one hour at 75 degrees Celsius, 100 degrees Celsius and 150 degrees Celsius, respectively.

After heating the demoulded magnetic body, the manufacturing method further includes trimming the edges of the connector and/or the magnetic body.

In one embodiment, the magnetic mixture is a clay-like mixture including by weight 90 to 95 parts of magnetic powder and 5 to 10 parts of resin.

Further, the magnetic powder is selected either from the group consisting of sintered or presintered ferrite powder, alloyed powder, amorphous or microcrystal powder, iron powder and any of the combinations thereof.

The resin is a thermosetting resin.

Before demoulding the magnetic body from the mold cavity, the manufacturing method further includes:

preheating the mold cavity and the magnetic body.

In the above steps, the pressure applied on the magnetic mixture is from 1 to 50 kilograms per square centimeter; the temperature for increasing the temperature of the demoulded magnetic body by heating increases from room temperature to 120 to 200 degrees Celsius; the time period for heating demoulded magnetic body is 10 to 120 minutes; the preheating temperature is 120 to 200 degrees Celsius; and the time period for preheating is 10 to 120 minutes.

The magnetic mixture includes by weight 90 parts of a mixture of amorphous powder and alloyed powder and 10 parts of epoxy resin, the pressure applied on the magnetic mixture is 20 kilograms per square centimeter, the preheating temperature is 150 degrees Celsius, the time period for preheating is 20 minutes, the temperature for heating the demoulded magnetic body is 150 degrees Celsius, and the time period for heating the demoulded magnetic body is 30 minutes.

After heating the demoulded magnetic body, the manufacturing method further includes polishing the surface of the power supply module to improve smoothness.

After heating the demoulded magnetic body, the manufacturing method further includes trimming the edges of the connector and/or the magnetic body.

In one embodiment, the connector is processed by a PCB substrate.

In one embodiment, the connector is processed by injection moulding a pre-made lead frame.

After connecting the electronic components and the coil to the connector, the manufacturing method further includes coating a connection portion between the connector and the electronic components or the coil, and the top of the integrated circuit chip with an insulating material.

In the above steps, when configuring the coil, the coil is wound round a magnetic core in advance, and connected to the connector in the preset circuit connection configuration.

According to another aspect of the present invention, a power supply module is provided, including:

a coil, including a coil body and coil terminals;

electronic components, including at least an integrated circuit chip;

a connector, electrically connected to the coil and the electronic components, and including a terminal adapted for external electrical connections; and a magnetic body, configured to encapsulate the coil and the electronic components completely, without spaces and/or gaps between the coil, the electronic components and the magnetic body, wherein the magnetic body covers completely at least the coil, the electronic components and a portion of the connector adapted to house the coil and the electronic components, and the terminal of the connector is exposed outside.

In one embodiment, the magnetic body completely encapsulates the coil, the electronic components and the connector, and there is no space and/or gap between the magnetic body and the coil, the electronic components, the connector.

The power supply module further includes a magnetic core, wherein the coil is wound around the magnetic core to form a magnetic assembly, and the magnetic assembly is electrically connected to the connector through the coil terminals and is attached to the connector.

The magnetic core is selected from the group consisting of rivet-like magnetic core, columnar magnetic core, I-shaped magnetic core, sheet magnetic core and a combination thereof.

The magnetic core has a higher magnetic permeability than that of the magnetic body.

In one embodiment, one coil is provided and located above the electronic components.

In one embodiment, one coil is provided and located on side of the electronic components.

In one embodiment, a plurality of coils are provided and located on side of and/or above the electronic components.

In one embodiment, the connector is a Printed Circuit Board (PCB).

In one embodiment, the connector includes a connection circuit and a plastic insulating substrate which encapsulates the connection circuit.

In one embodiment, a plurality of integrated circuit chips are used.

In one embodiment, the electronic components comprise an integrated circuit chip which contains resistors, capacitors, MOSFETs, a drive circuit and a pulse width modulator.

In one embodiment, the electronic components further include a resistor and/or a capacitor.

The integrated circuit chip contains MOSFETs, a drive circuit and a pulse width modulator.

In one embodiment, the electronic components further include a MOSFET.

The integrated circuit chip contains resistors, capacitors, a drive circuit and a pulse width modulator.

Edges of the magnetic body do not extend beyond edges of the connector.

The shape of connector is a polygon, the magnetic body is also a polygon corresponding to the connector, and at least one edge of the magnetic body does not extend beyond edges of the connector.

The advantages and principles of the above technical solution are described below. With the above manufacturing method for the power supply module, the magnetic mixture is packed in the mold cavity of the connector to form a magnetic body under pressure, the magnetic body and the connector housed with the coil and the electronic components are moulded in one body, and the magnetic body is heated by temperature increasing after being demoulded. In this way, the magnetic body is hardened, and the strength of the connections between the magnetic body and the coil, the electronic components and the connector are strengthened, so the magnetic body, the coil, the electronic components and the connector are shaped firmly together as a whole. After the magnetic mixture being packed in the mold cavity to form a magnetic body under pressure, the magnetic body is required to be heated by temperature increasing, so it can greatly reduce the pressure required in the moulding of the magnetic body in the mold cavity, to avoid damaging the coil, the electronic components and the connector within the magnetic body, and reduce manufacturing cost. For the manufactured power supply module, the inner coil, electronic components and connector are completely encapsulated by the magnetic body, and it can realize that there is even no space and/or gap between the magnetic body and the coil, the electronic components or the connector, so the manufacturing method can not only make a power supply module of a small volume to satisfy the demand for the miniaturization development, but also maximizes the balance of the heat distribution of the whole power supply module to further improve the heat transfer effect, since the inner coil, electronic components and connector directly contact with the magnetic body. The magnetic body can effectively protect each inner component and reduce electromagnetic interference, to further improve the electrical characters of the power supply module. At the same time, the mechanical strength of the manufactured power supply module is also greatly improved, so that the power supply module is capable of withstanding greater vibration. Compared with the traditional method, the manufacturing method according to the present invention has no restriction from the side walls of the magnetic body because it does not have to make the magnetic body in advance, so it can have more selectable space to arrange electronic components and use a coil of a larger volume. In addition, in the manufacturing method, since the electronic components does not have to be limited in a reserved space, the configuration of the electronic components on the connector can be optimized according to the need, to improve the total performance of the power supply module. The power supply module manufactured by the manufacturing method can result in more compact and reliable packaging effect, to greatly improve the humidity performance of the product. In addition, the connection between the magnetic body and the connector of the power supply module is very stable, with a significant seismic performance. Further, since the coil (inductor) requires no additional design and manufacture, and is formed at the same time as manufacturing the power supply module, the production time can be greatly shortened and the manufacturing cost can be reduced.

In the above power supply module, the magnetic body is configured to completely encapsulate the coil and the electronic components to leave no space and/or gap between the magnetic body and the coil or the electronic components so that the coil, the electronic components and the connector directly contact the magnetic body, to maximize the balance of the heat distribution of the whole power supply module to further improve the heat transfer effect of the power supply module. The magnetic body covers completely at least the coil, the electronic components and a portion of the connector adapted to house the coil and the electronic components, and the terminal of the connector is exposed outside, such that the magnetic body can effectively protect each inner component and reduce electromagnetic interference, to further improve the electrical characters of the power supply module.

BRIEF DESCRIPTION OF THE DRAWINGS

The accompanying drawings illustrate one or more embodiments of the present invention and together with the written description, serve to explain the principles of the present invention. Wherever possible, the same reference numbers are used throughout the drawings to refer to the same or like elements of an embodiment.

DETAILED DESCRIPTION OF THE PREFERRED EMBODIMENTS

Figure 1:
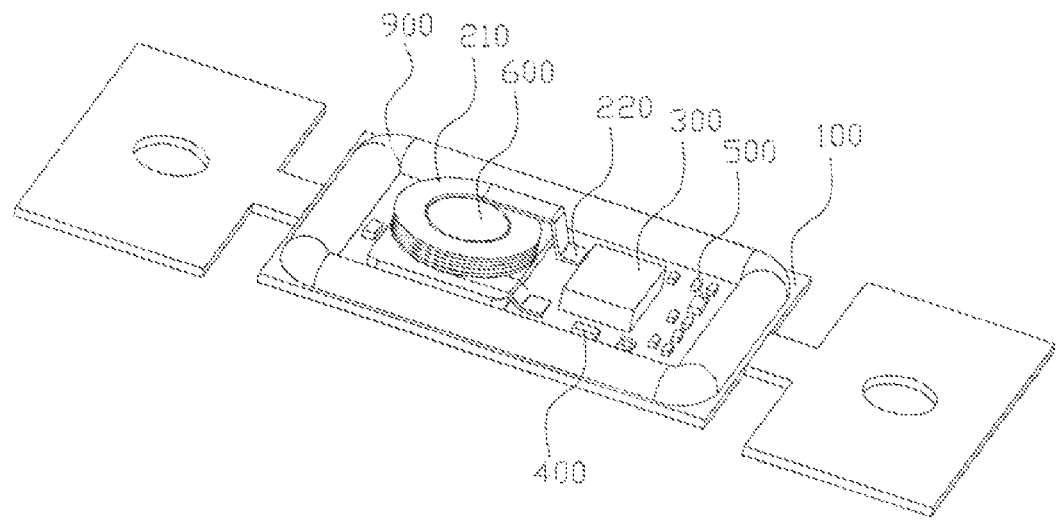
FIG. 1 is a schematic diagram illustrating a connector configured with a coil and an electronic components according to one embodiment of the present disclosure.

In the following description of embodiments, reference is made to the accompanying drawings which form a part hereof, and in which it is shown by way of illustration specific embodiments of the present invention that can be practiced. It is to be understood that other embodiments can be used and structural changes can be made without departing from the scope of the disclosed embodiments.

Embodiment One

As shown in FIGS. 1-7, a manufacturing method for a power supply module is provided, including the followings steps:

provide a connector 100 with a preset circuit connection configuration, and providing a terminal 110 adapted for external electrical connection on the connector 100;

configuring an electronic components including at least an integrated circuit chip 300, in the preset circuit connection configuration of the connector 100 by electrical connection, configuring a coil 200 such that coil terminals are electrically connected to the other circuit parts in the preset circuit connection configuration;

preparing a mold cavity 101, and placing the connector 100 configured with the coil 200 and the electronic components into the mold cavity 101;

making a magnetic mixture 800, and filling the magnetic mixture 800 in the mold cavity 101 where the connector 100 is placed to form a magnetic body 700 under pressure, wherein the magnetic body 700 encapsulates at least the coil 200, the electronic components and a portion of the connector 100 adapted to house the coil 200 and the electronic components, and the terminal 110 is exposed outside the magnetic body 700;

demoulding the magnetic body 700 from the mold cavity 101; and heating the demoulded magnetic body 700 by temperature increasing.

See FIG. 1. A binder 900 is coated on the periphery of the connector 100 configured with the coil 200 and the electronic components, to improve the moulding precision and strength.

With the manufacturing method for the power supply module according to the embodiment, the magnetic mixture 800 is packed in the mold cavity 101 of the connector 100 to form a magnetic body 700 under pressure, the magnetic body 700 and the connector 100 configured with the coil 200 and the electronic components are moulded in one body, and the magnetic body 700 is heated by temperature increasing after being demoulded. In this way, the magnetic body 700 is hardened, and the strength of the connections between the magnetic body 700 and the coil 200, the electronic components and the connector 100 are strengthened, so the magnetic body 700, the coil 200, the electronic components and the connector 100 are shaped firmly together as a whole. After the magnetic mixture 800 being packed in the mold cavity 101 under pressure, the magnetic body 700 is required to be heated by temperature increasing, so it can greatly reduce the pressure required in the moulding of the magnetic body 700 in the mold cavity 101, to avoid damaging the coil 200, the electronic components and the connector 100 within the magnetic body 700, and reduce manufacturing cost. For the manufactured power supply module 20, the inner coil 200, electronic components and connector 100 are completely encapsulateed by the magnetic body 700, and it can realize that there is even no space and/or gap between the magnetic body 700 and the coil 200, the electronic components or the connector 100, so the manufacturing method can not only make a power supply module 20 of a small volume to satisfy the demand for the miniaturization development, but also maximizes the balance of the heat distribution of the whole power supply module 20 to further improve the heat transfer effect, since the inner coil 200, electronic components and connector 100 directly contact with the magnetic body 700. The magnetic body 700 can effectively protect each inner component and reduce electromagnetic interference, to further improve the electrical characters of the power supply module 20. At the same time, the mechanical strength of the manufactured power supply module 20 is also greatly improved, so that the power supply module 20 is capable of withstanding greater vibration. Compared with the traditional method, the manufacturing method according to the present invention has no restriction from the side walls of the magnetic body because it does not have to make the magnetic body in advance, so it can have more selectable space to arrange electronic components and use a coil of a larger volume. In addition, in the manufacturing method, since the electronic components do not have to be limited in a reserved space, the configuration of the electronic components on the connector 100 can be optimized according to the need, to improve the total performance of the power supply module 20. The power supply module 20 manufactured by the manufacturing method can result in more compact and reliable packaging effect, to greatly improve the humidity performance of the product. In addition, the connection between the magnetic body 700 and the connector 100 of the power supply module 20 is very stable, with a significant seismic performance. Further, since the coil 200 (inductor) requires no additional design and manufacture, and is formed at the same time as manufacturing the power supply module 20, the production time can be greatly shortened and the manufacturing cost can be reduced.

In the embodiment, the magnetic mixture 800 is a powder mixture including by weight 85 to 95 parts of magnetic powder and 5 to 15 parts of resin. The magnetic powder is selected either from the group consisting of sintered or presintered ferrite powder (such as Ni—Zn, Mg—Zn or Mn—Zn), alloyed powder (such as Fe—Si, Fe—Si—Al, Fe—Ni or Fe—Ni—Mo), amorphous or microcrystal powder (such as Fe-based amorphous alloy, Co-based amorphous alloy, Fe-based microcrystal alloy or Co-based microcrystal alloy), iron powder and combinations thereof. Particle size of the magnetic powder has a distribution range of 125 um to 400 um. The resin is a thermosetting resin, such as epoxy resin, phenolic resin, phenyl resin, silicon resin or combinations thereof. The resin contains a certain percentage of hardening agent. The magnetic mixture further includes by weight 0 to 5 parts of additive. The additive is selected from the group consisting of zinc stearate, magnesium stearate, barium stearate, calcium stearate and combinations thereof. The additive plays a lubricating function to increase the flowability of the magnetic powder, to improve the uniformity of the pressure transfer. The magnetic mixture 800 is formed by: adding dispersant such as acetone into the mixture of the magnetic powder and the resin, and slowly stirring the mixture at normal temperature for a time determined by the amount of the magnetic mixture 800, until there is no volatile solvent left, in which the weight ratio of the acetone to the resin is 80~85:15~20.

In the embodiment, the pressure applied on the magnetic mixture in the above steps is intermittent with pressure value less than or equal to 0.5 kilogram per square centimeter, with total repetition of 100 to 300 times at a repetition frequency of 100 to 300 times per minute. In this way, it can further ensure that the coil and the electronic components are encapsulateed by the magnetic mixture completely without spaces and/or gaps, to improve the stability and heat dispersion of the power supply module.

After forming a magnetic body by intermittent pressurization, the manufacturing method further includes the following steps:

applying both the pressure of 5 to 15 kilograms per square centimeter, and the heat with a temperature of 130 to 160 degrees Celsius on the magnetic body 700 for 5 to 20 minutes; and cooling the magnetic body 700 to room temperature and demoulding. In this way, it can strengthen the bonding strength between the connector 100 and the magnetic body 700, to make the connector 100 be connected with the magnetic body 700 compactly, to further improve the stability and heat dispersion of the power supply module.

The temperature for increasing the temperature of the demoulded magnetic body by heating in the above steps increases from room temperature to 100 to 150 degrees Celsius, and time for increasing the temperature of the demoulded magnetic body by heating is 120 to 480 minutes. For the traditional cold pressing method, the pressure required is generally from 2,000 to 3,000 kilograms per square centimeter, so that the power can be moulded for required shape and size, but the electronic components within the power supply module 20 may be damaged under too much pressure, and the insulation layer of the coil 200 also has a risk of being damaged, resulting in a short circuit of the coil or a "high frequency short circuit". The conjunctive point between the coil 200 and the connector 100 (for example, PCB substrate or metal wire frame (HOOP or Lead frame)) will produce open circuits due to powerful extrusion. In addition, for some particular designs or application fields, the inner high density and high brittleness magnetic core and other components or parts may be cracked because of excessive pressure, to impact the performance that they even cannot work. For the manufacturing method according to the embodiment, the power supply module can be moulded by applying an intermittent pressure less than or equal to 0.5 kilogram per square centimeter, applying both the pressure of 5 to 15 kilograms per square centimeter, and the heat with a temperature of 130 to 160 degrees Celsius, and heating by temperature increasing for a certain amount of time, and the moulded power supply module 20 has good mechanical strength and electrical performance.

Further, after heating the demoulded magnetic body, the manufacturing method further includes trimming the edges of the connector 100 and/or the magnetic body 700. The edges are trimmed by mechanical means such as cutting, to get a better appearance and control of higher precision. In addition, the manufacturing method further includes polishing the surface of the power supply module 20 to improve surface smoothness of the power supply module 20.

In the embodiment, the connector 100 is processed by a PCB substrate. Alternatively, the connector 100 may be processed by injection moulding of a preconfigured metal wire frame (Hoop or Lead Frame). As shown in FIG. 1, the integrated circuit chip 300, the resistor 400, the capacitor 500 and the magnetic core 600 in the embodiment are configured in the preset circuit connection configuration of the PCB substrate by electrical connection. Further, in the above steps, when configuring the coil 200, the coil 200 is wound round a magnetic core 600 in advance, and connected to the connector 100 in the preset circuit connection configuration, such that most of magnetic flux generated by the coil 200 is concentrated at the magnetic core 600, to increase the inductance, and improve the electrical performance of the whole power supply module 20.

Further, after connecting the electronic components and the coil 200 to the connector 100, the manufacturing method further includes coating an insulating material at connection between the connector 100 and the electronic components or the coil 200, and on the top of the integrated circuit chip 300. In order to have lower magnetic impedance, a magnetic material is generally used, and the insulating material can prevent short circuits, and further reduce the pressure on the electronic components caused by the magnetic body in manufacturing or during usage.

Embodiment Two

The manufacturing method of Embodiment Two is different than that of Embodiment One in that the magnetic mixture 800 includes by weight 92 parts of carboxyl iron power and 8 parts of epoxy resin, and the intermittent pressure applied on the magnetic mixture has a pressure of 0.2 kilogram per square centimeter, with total repetition of 200 times at a repetition frequency of 250 times per minute; the pressure applied to the magnetic body is 15 kilograms per square centimeter, the heat applied to the magnetic body is 160 degrees Celsius, and time of the pressure and the heat applied to the magnetic body is 5 minutes; and the temperature for increasing the temperature of the demoulded magnetic body by heating increases from room temperature to 150 degrees Celsius with a rate of 1 degree Celsius per minute, wherein the temperature is maintained for one hour at 75 degrees Celsius, 100 degrees Celsius and 150 degrees Celsius, respectively.

In the manufacturing method according to the embodiment, carboxyl iron power (CIP) of insulation and antirust function, and epoxy resin containing hardening agent are prepared and stirred at a temperature below 40 degrees Celsius or at room temperature to form a magnetic mixture 800; the intermittent pressure applied on the magnetic mixture has a pressure of 0.2 kilogram per square centimeter, with total repetition of 200 times at a repetition frequency of 250 times per minute, so that the magnetic mixture 800 completely encapsulates the coil and the electronic components without spaces; the pressure applied to the magnetic body is 15 kilograms per square centimeter, the heat applied to the magnetic body is 160 degrees Celsius, and time of the pressure and the heat applied to the magnetic body is 5 minutes, so that the bonding strength between the connector and the magnetic body is strengthened; the magnetic body 700 is demoulded from the mold cavity 101 when the magnetic body 700 is cooled to room temperature; and the temperature for increasing the temperature of the demoulded magnetic body by heating increases from room temperature to 150 degrees Celsius with a rate of 1 degree Celsius per minute, wherein the temperature is maintained for one hour at 75 degrees Celsius, 100 degrees Celsius and 150 degrees Celsius respectively, so that the magnetic body 700 can be further dried, to ensure the moulded power supply module 20 has good mechanical strength and electrical performance.

Embodiment Three

Figure 2:
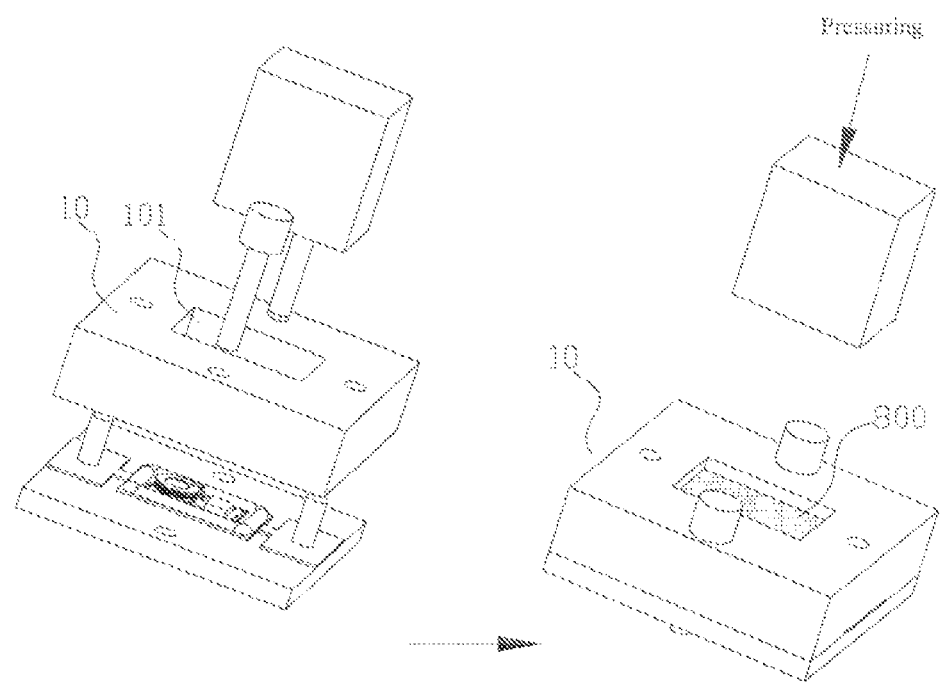
FIG. 2 is a schematic diagram illustrating the connector of FIG. 1 placed within a mould for moulding.

The manufacturing method of Embodiment Three is different than that of Embodiment One in that the magnetic mixture 800 is a clay-like mixture including by weight 90 to 95 parts of magnetic powder and 5 to 10 parts of resin. The magnetic powder is selected either from the group consisting of sintered or presintered ferrite powder, alloyed powder, amorphous or microcrystal powder, iron powder and any of the combinations thereof. The resin is a thermosetting resin, such as epoxy resin, phenolic resin, phenyl resin, silicon resin or combinations thereof. In the embodiment, the pressure applied on the magnetic mixture to form the magnetic body is not an intermittent pressure but a continuous pressure with a pressure of 1 to 50 kilograms per square centimeter. Instead of applying both pressure and heat on the magnetic body, the mold cavity and the magnetic body are pre-heated before demoulding the magnetic body from the mold cavity. The preheating temperature is 120 to 200 degrees Celsius, and the time period for preheating is 10 to 120 minutes. The demoulded magnetic body is heated by temperature increasing. The temperature for increasing the temperature of the demoulded magnetic body by heating increases from room temperature to 120 to 200 degrees Celsius, and the time for the heating the demoulded magnetic body is 10 to 120 minutes. In the embodiment, the magnetic mixture 800 is prepared as a clay-like mixture for transporting and moulding. As shown in FIG. 2, the PCB substrate provided with the integrated circuit chip 300, the resistor 400, the capacitor 500 and the magnetic core 600 in FIG. 1 is arranged within the mould 10. The magnetic mixture 800 encapsulates the periphery of PCB substrate by pressure, to form a magnetic body 700, and the required pressure is small, to ensure the inner components within the magnetic body 700 is not damaged. Through pre-heating and heating by temperature increasing, the manufactured power supply module 20 has good mechanical strength and electrical performance.

Figure 3:
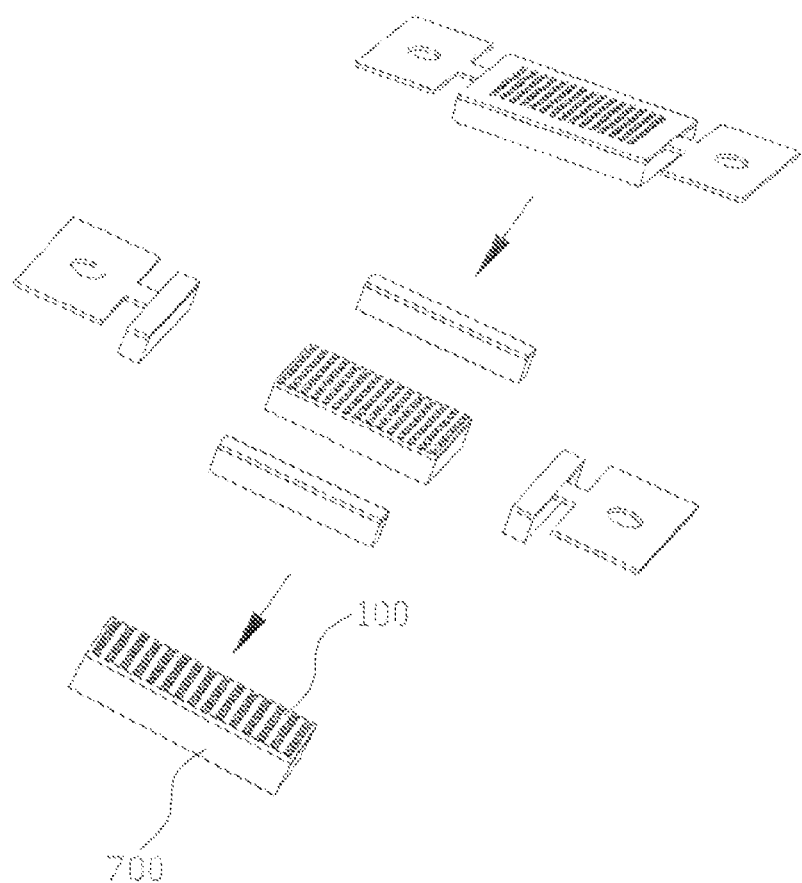
FIG. 3 is a schematic diagram illustrating trimming edges of the power supply module after heating by temperature increasing.
Figure 4A:
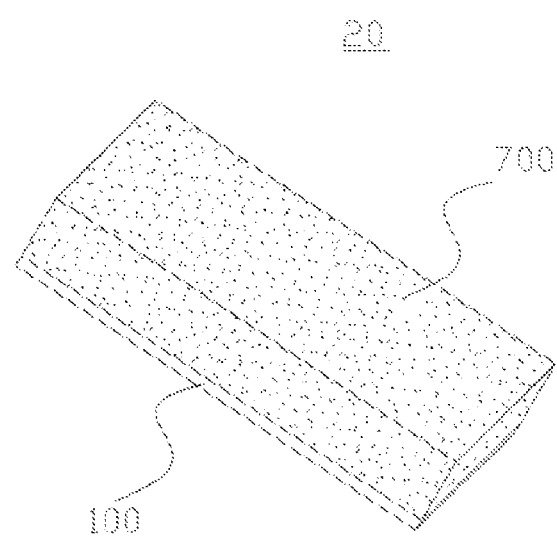
FIG. 4*a* is a front view of a manufactured power supply module according to one embodiment of the present disclosure.
Figure 4B:
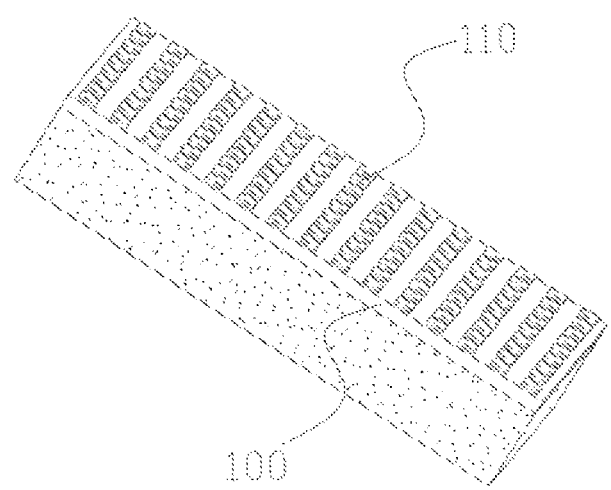
FIG. 4*b* is a bottom view of a manufactured power supply module according to one embodiment of the present disclosure.
Figure 4C:
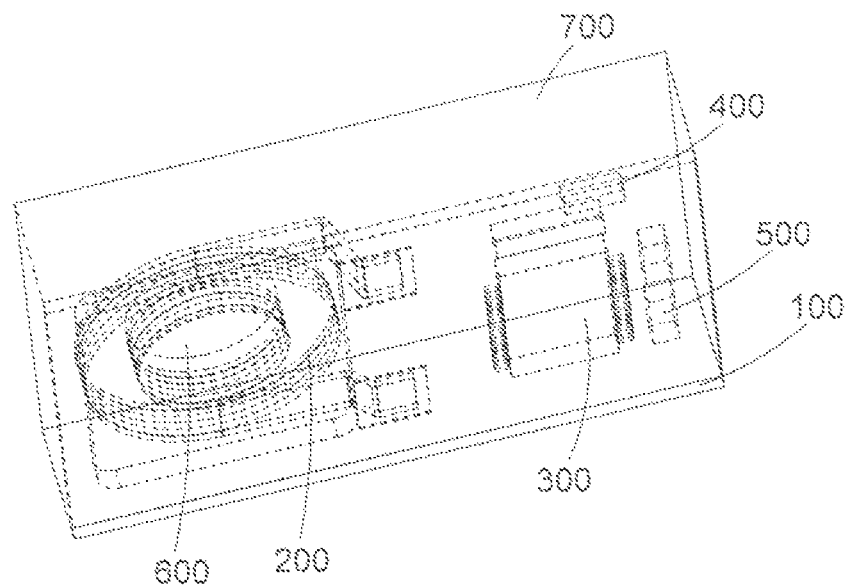
FIG. 4*c* is a perspective view of a manufactured power supply module according to one embodiment of the present disclosure.
Figure 5:
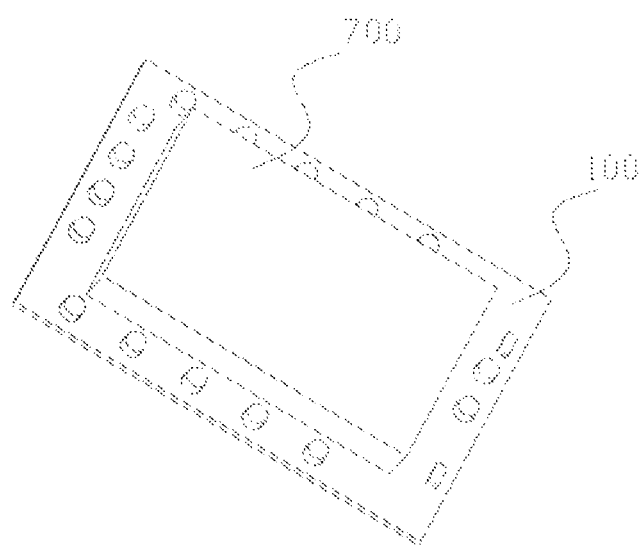
FIG. 5 is a schematic diagram illustrating the edge of the magnetic body does not extend the edge of the connector.
Figure 6:
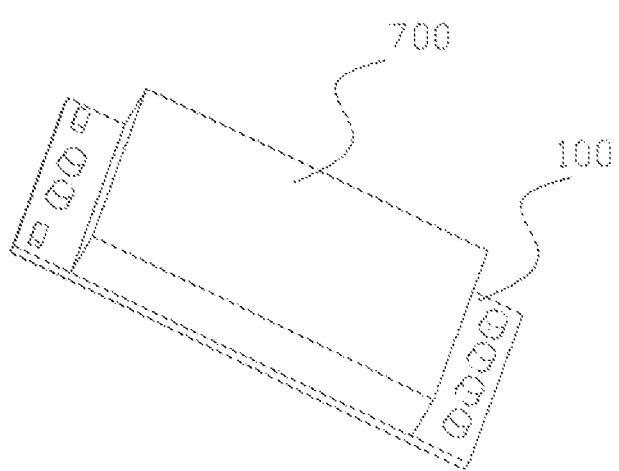
FIG. 6 is a schematic diagram illustrating both sides of the edge of the magnetic body is flushed with the edge of the connector.
Figure 7:
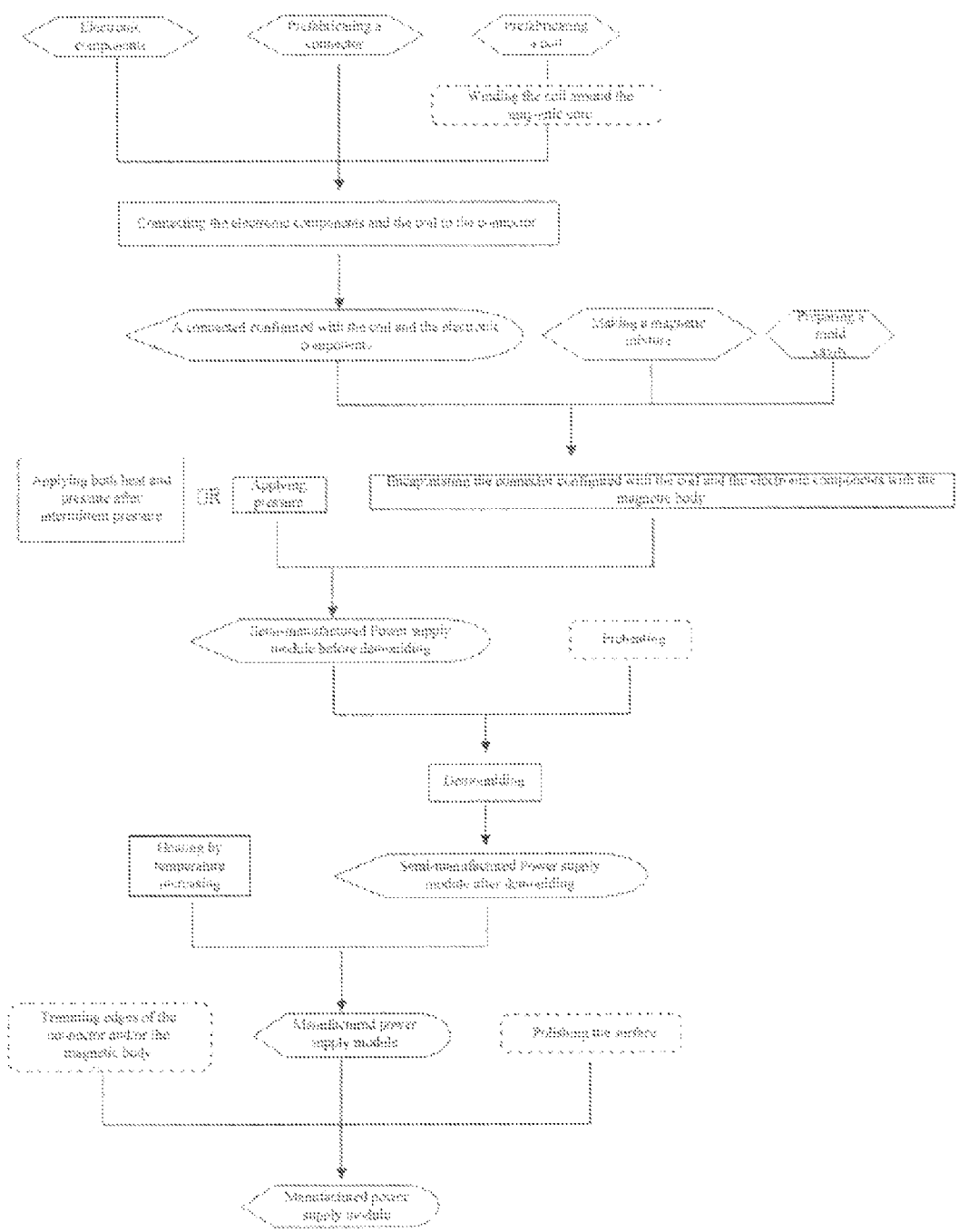
FIG. 7 is a flow diagram illustrating a manufacturing method for a power supply module according to one embodiment of the present disclosure.

As shown in FIG. 3, the manufacturing method according to the embodiment further includes polishing the surface of the power supply module 20 to improve surface smoothness of the power supply module 20, and trimming the edges of the connector 100 and/or the magnetic body 700 after heating the demoulded magnetic body. The edges are trimmed by mechanical means such as cutting, to get a better appearance and control of higher precision.

Embodiment Four

The manufacturing method of Embodiment Four is different than that of Embodiment Three in that the clay-like magnetic mixture 800 includes by weight 90 parts of a mixture of amorphous powder and alloyed powder and 10 parts of epoxy resin, the pressure applied on the magnetic mixture is 20 kilograms per square centimeter, the preheating temperature is 150 degrees Celsius, the time period for preheating is 20 minutes, the temperature for heating the demoulded magnetic body is 150 degrees Celsius, and the time period for heating the demoulded magnetic body is 30 minutes. In the manufacturing method according to the embodiment, magnetic power consisting of amorphous powder and alloyed powder, and epoxy resin are prepared and stirred at a temperature below 40 degrees Celsius or at room temperature to form a magnetic mixture 800; the pressure applied on the magnetic mixture has a pressure of 20 kilograms per square centimeter, the preheating temperature is 150 degrees Celsius, the time period for preheating is 20 minutes, so that the magnetic body 700 is preliminarily dried; and the magnetic body 700 is demoulded from the mold cavity 101, and heated to a temperature of 150 degrees Celsius for 30 minutes, so that the magnetic body 700 is further dried. In this way, it can ensure the moulded power supply module 20 have good mechanical strength and electrical performance. In addition, the processes of filling and pressure moulding can be just performed at room temperature without pre-heating, and the magnetic body 700 can be hardened by the above heating by temperature increasing to obtain the power supply module 20.

Embodiment Five

This example provides a power supply module 20 manufactured by the above manufacturing method. As shown in FIGS. 1-6, a power supply module 20 is provided, including:
a coil 200, including a coil body 210 and coil terminals 220;
electronic components, including at least an integrated circuit chip 300;
a connector 100, electrically connected to the coil 200 and the electronic components, and including a terminal 110 adapted for external electrical connection; and
a magnetic body 700, configured to encapsulate the coil 200 and the electronic components completely, without spaces and/or gaps between the coil 200, the electronic components and the magnetic body 700, wherein the magnetic body 700 covers completely at least the coil 200, the electronic components and a portion of the connector 100 adapted to house the coil 200 and the electronic components, and the terminal 110 of the connector 100 is exposed outside.

In the power supply module 20 according to the embodiment, the magnetic body 700 is configured to completely encapsulate the coil 200 and the electronic components to leave no space and/or gap between the magnetic body 700 and the coil 200 or the electronic components so that the coil 200, the electronic components and the connector 100 directly contact the magnetic body 700, to maximize the balance of the heat distribution of the whole power supply module 20 to further improve the heat transfer effect of the power supply module 20. The magnetic body 700 covers completely at least the coil 200, the electronic components and a portion of the connector 100 adapted to house the coil 200 and the electronic components, and the terminal 110 of the connector 100 is exposed outside, such that the magnetic body 700 can effectively protect each inner component and reduce electromagnetic interference, to further improve the electrical characters of the power supply module 20.

In the embodiment, the electronic components include a resistor 400, a capacitor 500 and an integrated circuit chip 300 containing resistors, capacitors, MOSFETs, a drive circuit and a pulse width modulator. Alternatively, the electronic components may only include an integrated circuit chip containing resistors, capacitors, a drive circuit and a pulse width modulator. Optionally, the electronic components include MOSFETs and an integrated circuit chip, and the integrated circuit chip is a unit module integrating resistors, capacitors, a drive circuit and a pulse width modulator. A plurality of integrated circuit chips 300 can be provided as needs. The connector 100 is a Printed Circuit Board. Alternatively, connector 100 may include a connection circuit and a plastic insulating substrate which coats the connection circuit.

As shown in FIG. 1, the power supply module 20 according to the embodiment further includes a magnetic core 600, wherein the coil body 210 is wound around the magnetic core 600 form a magnetic assembly, and the magnetic assembly is electrically connected to the coil mounting end of the connector 100 through the coil terminals 220 and attached to the connector 100. In the embodiment, the magnetic core 600 is a columnar magnetic core. It should be understood that the magnetic core 600 may be selected from the group consisting of rivet-like magnetic core, columnar magnetic core, I-shaped magnetic core, sheet magnetic core and a combination thereof, according to practical needs. The magnetic core 600 has a higher magnetic permeability than that of the magnetic body 700. Because the magnetic core 600 is made with a high density and high sintering temperature process, the magnetic core 600 has a higher magnetic permeability than that of the magnetic body 700 of a low density. In this way, the magnetic core 600 can made up for the shortage of the low magnetic permeability of the magnetic body 700, and supplement the performance of the whole power supply module 20.

In the embodiment, one coil 200 is provided and located on side of the electronic components.

Alternatively, the coil 200 may be also arranged above the electronic components according to the needs of the inner structure of the power supply module 20. It should be understood that a plurality of coils 200 may be provided and located on side of and/or above the electronic components according to the practical needs.

The magnetic body 700 keeps in touch tightly with the coil 200, the electronic components and the connector 100, and there is no space and/or gap between the magnetic body 700 and the coil 200, the electronic components or the connector 100. It can not only make a power supply module 20 of a small volume to satisfy the demand for the miniaturization development, but also maximizes the balance of the heat distribution of the whole power supply module 20 to further improve the heat transfer effect, since the inner coil 200, electronic components and connector 100 directly contact with the magnetic body. The conduction resistor and conduction loss of the MOSFET can be further reduced. In addition, the magnetic body 700 can effectively protect each inner component and reduce electromagnetic interference, to further improve the electrical characters of the power supply module 20.

As shown in FIGS. 4a, 4b, 4c, 5 and 6, edges of the magnetic body 700 are configured to not extend beyond edges of the connector 100. It should be understood that the connector 100 may have an aspect of polygon, the magnetic body 700 may also have an aspect of polygon corresponding to the connector, and at least one edge of the magnetic body does not extend beyond edges of the connector 100.

The above are preferred embodiments of the invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is that:
1. A manufacturing method for a power supply module, comprising the steps of:
providing a connector with a preset circuit connection configuration, and providing a terminal for external electrical connection on the connector;
configuring, by way of electrical connection, electronic components comprising at least an integrated circuit chip in the preset circuit connection configuration of the connector, configuring a coil such that coil terminals are configured by way of electrical connection in the preset circuit connection configuration of the connector;

preparing a mold cavity, and placing the connector housed with the coil and the electronic components into the mold cavity;

making a magnetic mixture, and filling the mold cavity where the connector is placed with the magnetic mixture to form a magnetic body under application of intermittent pressure, wherein the magnetic body encapsulates at least the coil, the electronic components and a portion of the connector adapted to house the coil and the electronic components, and the terminal is exposed outside the magnetic body;

demoulding the magnetic body from the mold cavity; and heating the demoulded magnetic body by increasing temperature.

2. The manufacturing method of claim 1, wherein the magnetic mixture is a powder mixture comprising by weight 85 to 95 parts of magnetic powder and 5 to 15 parts of resin by weight.

3. The manufacturing method of claim 2, wherein the magnetic mixture further comprises by weight 0 to 5 parts of additive.

4. The manufacturing method of claim 3, wherein the magnetic powder is selected either from the group consisting of sintered or presintered ferrite powder, alloyed powder, amorphous or microcrystal powder, iron powder and any of the combinations thereof.

5. The manufacturing method of claim 4, wherein particle size of the magnetic powder has a distribution range of 125 um to 400 um.

6. The manufacturing method of claim 2, wherein the intermittent pressure applied on the magnetic mixture in the above steps has a pressure value less than or equal to 0.5 kilogram per square centimeter, with total repetition of 100 to 300 times at a repetition frequency of 100 to 300 times per minute.

7. The manufacturing method of claim 6, wherein after forming a magnetic body under intermittent pressure, the manufacturing method further comprises the following steps:

applying both a pressure of 5 to 15 kilograms per square centimeter, and heat with a temperature of 130 to 160 degrees Celsius on the magnetic body for 5 to 20 minutes; and cooling the magnetic body to room temperature before demoulding.

8. The manufacturing method of claim 7, wherein heating the demoulded magnetic body comprises increasing the temperature from room temperature to a range of 100 to 150 degrees Celsius, and time taken by increasing the temperature of the demoulded magnetic body by heating is 120 to 480 minutes.

9. The manufacturing method of claim 8, wherein the resin is a thermosetting resin.

10. The manufacturing method of claim 9, wherein the magnetic mixture comprises by weight 92 parts of carboxyl iron power and 8 parts of epoxy resin, and the intermittent pressure applied on the magnetic mixture has a pressure of 0.2 kilogram per square centimeter, with total repetition of 200 times at a repetition frequency of 250 times per minute; the heat and pressure simultaneously applied to the magnetic body is 15 kilograms per square centimeter in 160 degrees Celsius for 5 minutes; and the temperature for increasing the temperature of the demoulded magnetic body by heating increases from room temperature to 150 degrees Celsius with a rate of 1 degree Celsius rise per minute, wherein the temperature is maintained for one hour at 75 degrees Celsius, 100 degrees Celsius and 150 degrees Celsius, respectively.

11. The manufacturing method of claim 8, wherein after heating the demoulded magnetic body, the manufacturing method further comprises:

trimming the edges of the connector and/or the magnetic body.

12. The manufacturing method of claim 2, wherein the connector is processed by a PCB substrate.

13. The manufacturing method of claim 2, wherein the connector is processed by injection moulding a pre-made lead frame.

14. The manufacturing method of claim 2, wherein after connecting the electronic components and the coil to the connector, the manufacturing method further comprises:

coating a connection portion between the connector and the electronic components and the coil, and the top of the integrated circuit chip with an insulating material.

15. The manufacturing method of claim 2, wherein when configuring the coil in the above steps, the coil is wound around a magnetic core prior to being connected to the connector in the preset circuit connection configuration.

16. The manufacturing method of claim 1, wherein the magnetic mixture is a clay-like mixture comprising by weight 90 to 95 parts of magnetic powder and 5 to 10 parts of resin.

17. The manufacturing method of claim 16, wherein the magnetic powder is selected either from the group consisting of sintered or presintered ferrite powder, alloyed powder, amorphous or microcrystal powder, iron powder and any of the combinations thereof.

18. The manufacturing method of claim 16, wherein the resin is a thermosetting resin.

19. The manufacturing method of claim 16, wherein before demoulding the magnetic body from the mold cavity, the manufacturing method further comprises:

preheating the mold cavity and the magnetic body.

20. The manufacturing method of claim 19, wherein the pressure applied on the magnetic mixture ranges from 1 to 50 kilograms per square centimeter; increasing the temperature of the demoulded magnetic body by heating comprises increasing the temperature from room temperature to a temperature range of 120 to 200 degrees Celsius; the time period taken by heating the demoulded magnetic body is 10 to 120 minutes; the temperature range of preheating is 120 to 200 degrees Celsius; and the time period for preheating is 10 to 120 minutes.

21. The manufacturing method of claim 20, wherein the magnetic mixture comprises by weight 90 parts of a mixture of amorphous powder and alloyed powder and 10 parts of epoxy resin, the pressure applied on the magnetic mixture is 20 kilograms per square centimeter, the preheating temperature is 150 degrees Celsius, the time period for preheating is 20 minutes, the temperature of heating the demoulded magnetic body is from room temperature to 150 degrees Celsius, and the time period for heating the demoulded magnetic body is 30 minutes.

22. The manufacturing method of claim 16, wherein after heating the demoulded magnetic body, the manufacturing method further comprises:

polishing the surface of the power supply module to improve smoothness.

23. The manufacturing method of claim 16, wherein after heating the demoulded magnetic body, the manufacturing method further comprises:
   trimming the edges of the connector and/or the magnetic body.

24. The manufacturing method of claim 1, wherein the making a magnetic mixture is performed at room temperature.

25. The manufacturing method of claim 1, wherein the making a magnetic mixture is performed at below 40 degrees Celsius.

26. The manufacturing method of claim 1, wherein the intermittent pressure is applied at room temperature.

27. The manufacturing method of claim 1, wherein the intermittent pressure is applied at below 40 degrees Celsius.

28. The manufacturing method of claim 1, wherein no heat is applied prior to completion of the making a magnetic mixture.

* * * * *